US008198919B1

(12) United States Patent
Kozhanov et al.

(10) Patent No.: US 8,198,919 B1
(45) Date of Patent: Jun. 12, 2012

(54) SPIN TRANSFER TORQUE TRIAD FOR NON-VOLATILE LOGIC GATES

(75) Inventors: Alexander Kozhanov, Santa Barbara, CA (US); S. James Allen, Santa Barbara, CA (US); Christopher Palmstrom, Santa Barbara, CA (US)

(73) Assignee: The Regengs of the University of California, Oakland, CA (US)

( * ) Notice: Subject to any disclaimer, the term of this patent is extended or adjusted under 35 U.S.C. 154(b) by 0 days.

(21) Appl. No.: 13/033,347

(22) Filed: Feb. 23, 2011

(51) Int. Cl.
H03K 19/20 (2006.01)
(52) U.S. Cl. ............. 326/104; 326/52; 326/54; 326/136
(58) Field of Classification Search ........................ None
See application file for complete search history.

(56) References Cited

U.S. PATENT DOCUMENTS

| | | | | |
|---|---|---|---|---|
| 2007/0164336 A1* | 7/2007 | Saito et al. | ..................... | 257/295 |
| 2011/0115522 A1* | 5/2011 | Javerliac et al. | ................ | 326/35 |

OTHER PUBLICATIONS

Powerpoint Presentation Slides by Alexander Kozhanov entitled "Spin Torque Triad", Nanoelectronics Research Initiative Annual Review, Oct. 27, 2010, Washington, D.C.
Bramwell, S. et al., "Spin ice state in frustrated magnetic pyrochlore materials," Science, vol. 294, Nov. 16, 2001, 1495.
Coehoorn, R., "Giant magnetoresistance and magnetic interactions in exchange-biased spin-valves," Handbook of Magnetic Materials, vol. 15, ed. K.H.J. Buschow, Elsevier, Amsterdam (2003), pp. 19-25.
Harris, M. et al., "Geometrical frustration in the ferromagnetic pyrochlore $Ho_2Ti_2O_7$," Physical Review Letters, vol. 79, No. 13, Sep. 29, 1997, 2554.
Hinchey, L. et al., "Magnetic properties of superlattices formed from ferromagnetic and antiferromagnetic materials," Physical Review B, vol. 33, No. 5, Mar. 1, 1986, 3329.
Ikeda, S. et al., "Magnetic tunnel junctions for spintronic memories and beyond," IEEE Transactions on Electron Devices, vol. 54, No. 5, May 2007, 991.
Leem, L. et al., "Magnetic coupled spin-torque devices and magnetic ring oscillator," 2008 International Electron Devices Meeting Technical Digest.
Leem, L. et al., "Magnetic coupled spin-torque devices for nonvolatile logic applications," Journal of Applied Physics 105, 07D102 (2009).
Nikonov, D., "Proposal of a spin torque majority gate logic," IEEE Electron Device Letters, arXiv:1006.4663v1 [cond-mat.mes-hall], 2011, pp. 1-3.
Ralph, D. et al., "Spin transfer torques," Journal of Magnetism and Magnetic Materials 320 (2008) 1190-1216.
Slonczewski, J., "Current-driven excitation of magnetic multilayers," Journal of Magnetism and Magnetic Materials 159 (1996) L1-L7.
Wood, R., "Future hard disk drive systems," Journal of Magnetism and Magnetic Materials 321 (2009) 555-561.

* cited by examiner

*Primary Examiner* — Anh Tran
(74) *Attorney, Agent, or Firm* — Gates & Cooper LLP

(57) ABSTRACT

A non-volatile logic gate, including a magnetic material having a shape induced magnetic anisotropy, wherein a shape of the magnetic material has a first vertex, a second vertex, and a third vertex and supports a single magnetic domain; regions of the magnetic material including a first input region adjacent the first vertex, a second input region adjacent the second vertex, and an output region adjacent a third vertex; the first input region for receiving a first logic input to the logic gate, the second input region for receiving a second logic input to the logic gate, and the output region for outputting at least one logic output of the logic gate; and the shape induced magnetic anisotropy determining at least part of a truth table for the logic gate, so that the logic gate produces the at least one logic output from the logic inputs using the shape.

26 Claims, 11 Drawing Sheets

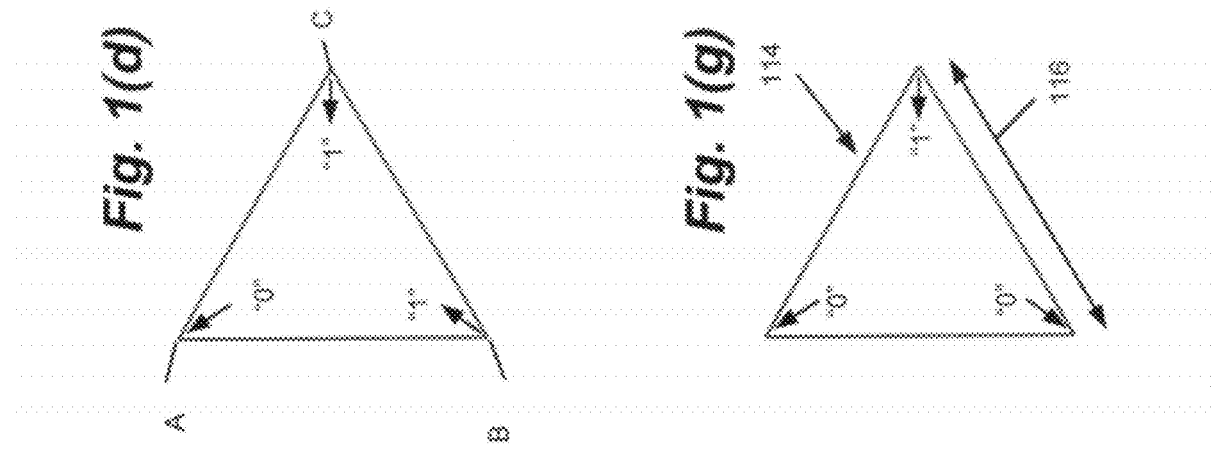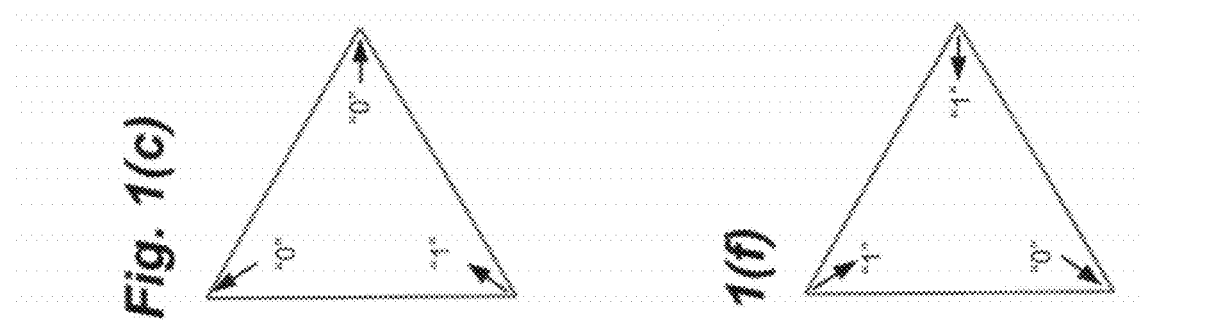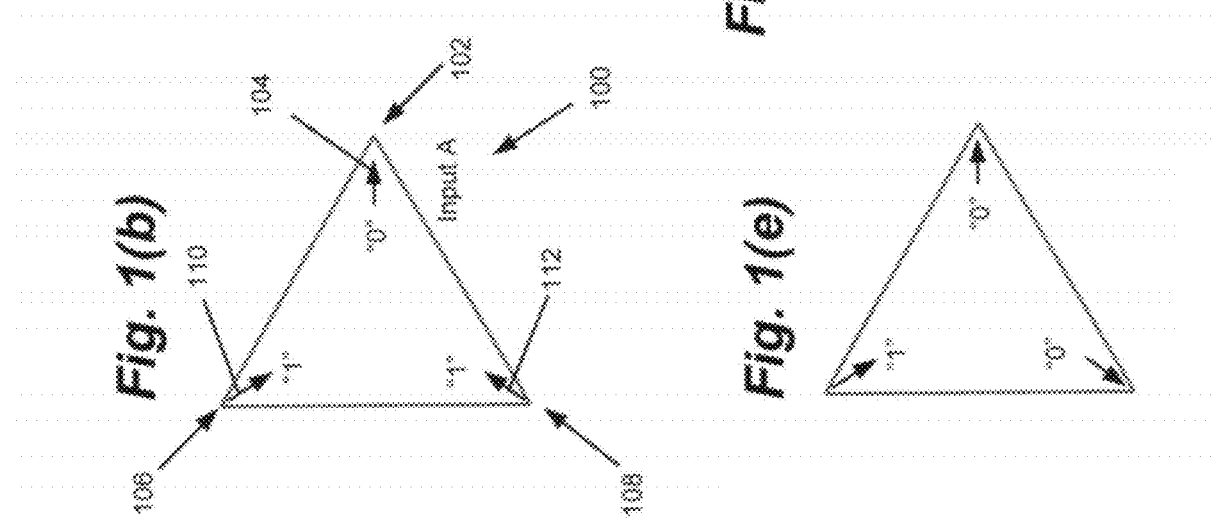

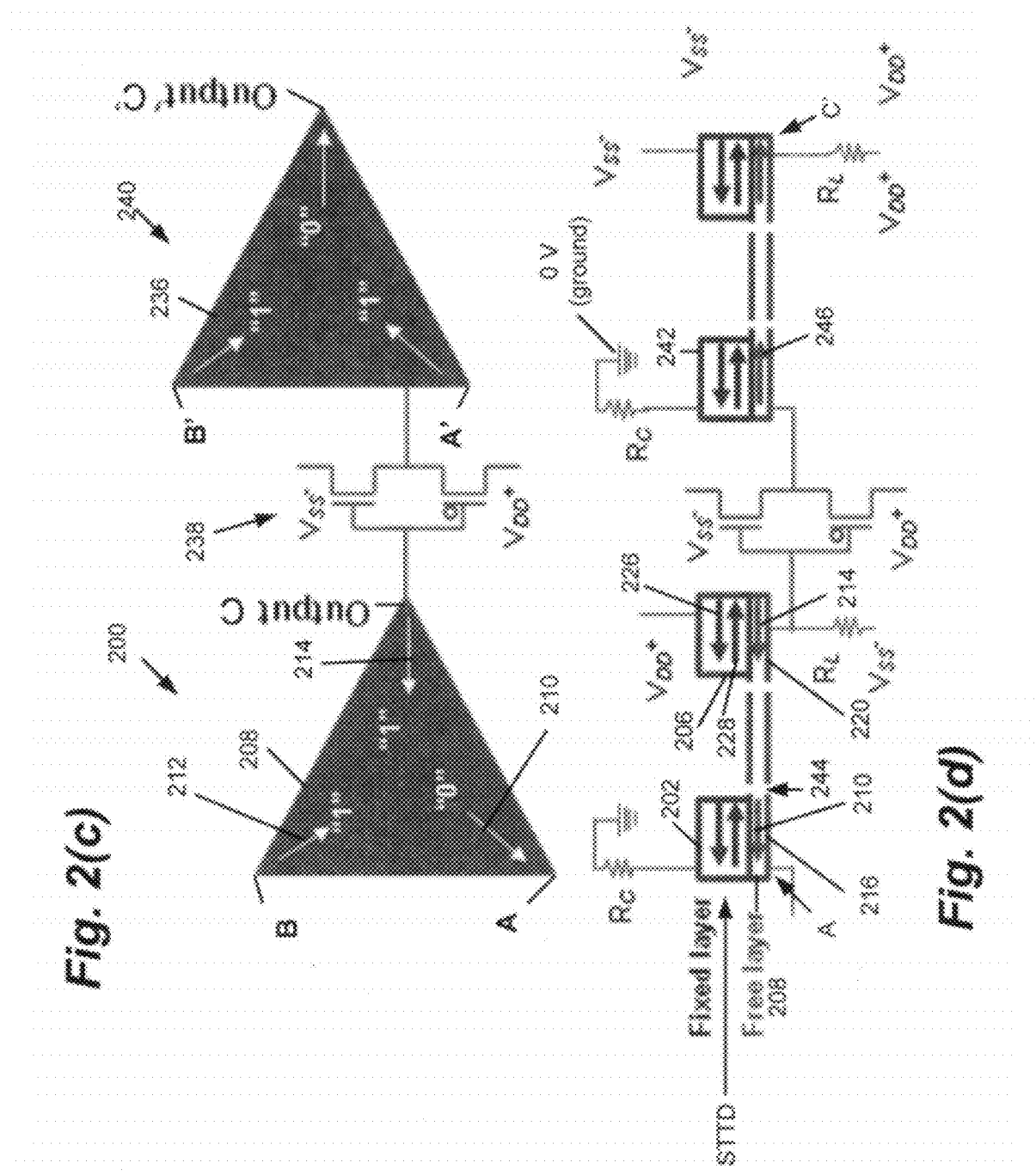

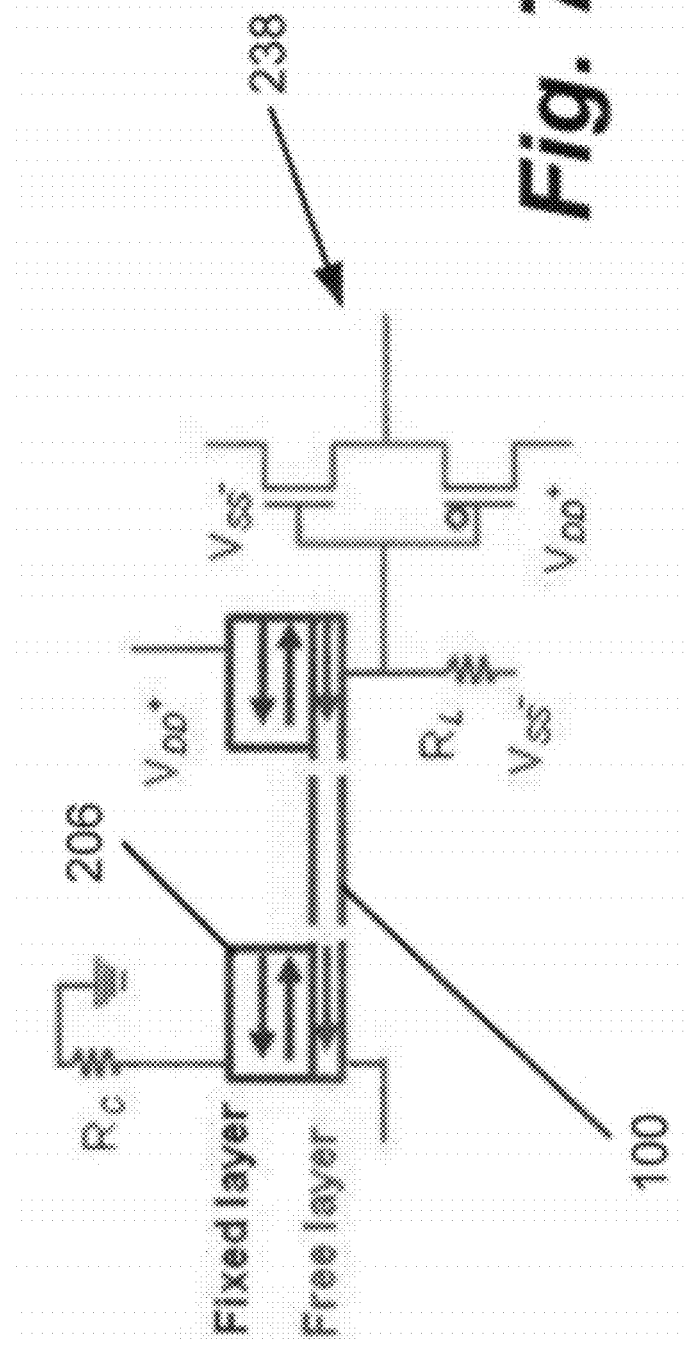

SPIN TRANSFER TORQUE TRIAD FOR NON-VOLATILE LOGIC GATES

BACKGROUND OF THE INVENTION

1. Field of the Invention

This invention relates to logic gates, digital electronics for signal processing, storage and computation, and methods of fabricating the same.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Spin Transfer Torque (STT) devices and spin valves are well documented in the literature. A spin valve device comprises a first conductive magnetic layer (fixed layer) and a second conductive magnetic layer (free layer), separated by a spacer layer, wherein the fixed layer, free layer, and spacer layers produce a device that exhibits Giant Magneto Resistance (GMR). The orientation of the magnetic moments in the fixed layer are fixed or pinned while the orientation of the magnetic moments in the free layer are not fixed and are consequently free to rotate in response to magnetic fields.

According to the GMR effect, when the magnetic moments in the fixed layer and the free layer are aligned (or parallel and pointing in the same direction), the device exhibits much smaller resistance as compared to when the magnetic moments in the fixed layer and the free layer are not aligned (or are anti parallel and pointing in the opposite direction).

Accordingly, if the magnetization orientation in the free layer is initially aligned with the magnetization orientation in the fixed layer (due to the weak spin coupling provided by the spacer layer), a magnetic field passing near the free layer may re-orient the magnetization orientation of the free layer with respect to the magnetization orientation of the fixed layer, causing a large change in resistance of the spin valve due to the GMR effect, which is sensed by current passing between the fixed layer and the free layer. Such an implementation is used as a read head sensor for hard drives, for example [1].

The GMR effect is also exploited for Magnetic Random Access Memory (MRAM). In the early MRAM the free layer magnetization reorientation was performed by applying a magnetic field generated by current in a write line: the state of the memory element is read by sensing the resistance via the GMR effect. More recently the spin transfer torque (STT) effect is used to write the magnetization state of the free layer [2-4]. An STT device (STTD) is a three layer device comprising a first, fixed, ferromagnetic metallic layer and a free, second, metallic, ferromagnetic layer separated from the first by a thin conductor or an insulator thin enough to allow electron tunneling. A spin polarized current (a current comprising electrons having predominantly one spin orientation) will reorient the free layer to be parallel or anti parallel as the electrons flow from the fixed to the free layer or from the free to fixed layer, respectively. In this way the relative magnetization orientation of the two layers can be "written" and "read" by suitable current flow through the STT device. Large currents are used to write (STT effect); small currents to sense the resistance (GMR effect).

The first and second layers of the STT device do not require power to retain their relative magnetization orientations, and therefore such a memory implementation is non-volatile—i.e., the data or information remains stored when the power to the device is switched off.

However, conventional magnetic memories or devices (e.g., MRAM) that are used to replace solid state memories such as Dynamic Random Access Memory (DRAM), Static Random Access Memory (SRAM), and flash memory, are not capable of executing logic. Instead, conventional devices use the transistor (e.g., CMOS) to perform logic operations. Replacing some transistors in the logic device with a patterned magnetic material may reduce the device size and cause such a device to be faster and cheaper.

Thus, there is a need for magnetic devices to perform logic operation in addition to being able to store information in a non-volatile way. The present invention satisfies this need by extending the capability of magnetic devices and adding logic operation to magnetic memory elements.

SUMMARY OF THE INVENTION

One or more embodiments of the present invention comprise connecting STT-MRAM to a single domain nanoscale magnet in order to execute a logic function, and using the STT-MRAM to both read from and write to the single domain nanoscale magnet.

Thus, to overcome the limitations in the prior art, and to overcome other limitations that will become apparent upon reading and understanding the present specification, the present invention discloses a non-volatile logic gate, comprising a magnetic material having a shape induced magnetic anisotropy, wherein the shape of the magnetic material has a first vertex, a second vertex, and a third vertex and supports a single magnetic domain; regions of the magnetic material including a first input region adjacent the first vertex, a second input region adjacent the second vertex, and an output region adjacent a third vertex; the first input region for receiving a first logic input to the logic gate, the second input region for receiving a second logic input to the logic gate, and the output region for outputting at least one logic output of the logic gate; and the shape induced magnetic anisotropy determining at least part of a truth table for the logic gate, so that the logic gate produces the at least one logic output from the logic inputs using the shape.

The role of the shape is to induce the magnetic anisotropy which define the magnetic states of the shaped magnet. In the present invention, the triangular shape introduces the magnetic anisotropy which defines the spin-ice like magnetic ground states of the magnet. However, other shapes may be used that introduce the magnetic shape anisotropy.

The present invention is not limited to any particular dimension of the ferromagnet, so long as the ferromagnet supports a single magnetic domain.

The magnetic material may be a ferromagnet at a temperature of operation of the logic gate.

The shape induced magnetic anisotropy is such that the truth table defines the logic gate as a NAND gate or a NOR gate. For example, the shape may be a triangle (e.g., isosceles, scalene, or equilateral triangle). Alternatively, the shape may have curved sides (e.g., concave sides) connecting the vertices.

The shape, and shape induced magnetic anisotropy, impart bistability to the logic gate that enables the logic gate to be initialized as either a NAND gate or a NOR gate.

The shape, and shape induced magnetic anisotropy, may be such that local magnetization alignments at each of the vertices obey the spin ice rule [5-6].

The first input region, the second input region, and the output region may, may or may not, be electrically isolated from each other.

The first input region may have a first local magnetization alignment defined by the first logic input, the second input region may have a second local magnetization alignment defined by the second logic input, and the output region may have a third output magnetization alignment that defines the logic output and which is initialized to define the logic gate as the NAND gate or the NOR gate. The shape and shape induced magnetic anisotropy may be such that there are exactly six energy equivalent combinations for the directions of the first local magnetization alignment, the second magnetization alignment, and the output local magnetization alignment. The shape and shape induced magnetic anisotropy may be such that two of the local magnetizations are aligned to point away from their respective vertices and one of the local magnetizations is aligned to point towards its respective vertex, or one of the local magnetizations is aligned to point away from its respective vertex and two of the local magnetizations are aligned to point towards their respective vertices.

The logic gate may produce the at least one logic output from the logic inputs using the shape induced magnetic anisotropy when (1) the logic inputs include concurrent writing pulses that switch the first local magnetization and the second local magnetization, wherein a positive writing pulse represents logic state "1" and a negative writing pulse represents logic state "0"; and (2) the output region receives initialization pulses that align the third output magnetization (selecting one of the bistable ground states of the ferromagnet) to initialize the logic gate as a NOR gate or NAND gate, each time the logic gate receives the writing pulses. The initialization pulses begin either earlier or concurrently with the writing pulses, and the initialization pulse should end before the trailing edge of the writing pulses so that the logic gate is initialized by a trailing edge of the initialization pulse.

In one or more embodiments, the initialization pulses may be positive to achieve a NAND gate, or the initialization pulses may be negative to achieve a NOR gate.

The logic gate may further comprise a Spin Transfer Torque (STT) Triad including a first fixed layer, a second fixed layer, and a third fixed layer coupled by a single free layer, wherein the single free layer is the magnetic material; and one or more spacer layers separating the fixed layers from the free layer such that the fixed layers are electrically coupled to the free layer.

The logic gate may further comprise (a) the first fixed layer providing the first logic input that orients the first local magnetization so as to point the first local magnetization alignment in a direction towards or away from the first vertex, (b) the second fixed layer providing the second logic input that orients the second local magnetization alignment so as to point the second local magnetization alignment in a direction towards or away from the second vertex, and (c) the third fixed layer providing an initialization pulse that orients the third local magnetization alignment so as to point the third local magnetization alignment in a direction towards or away from the third vertex to define the truth table that defines the logic gate as a NAND gate or a NOR gate.

The third fixed layer may be positioned to read the logic output using the GMR effect.

However, in other embodiments, instead of the fixed layers, the magnetizations may be aligned by a multiferroic element.

The towards direction of the magnetization alignment may indicate a logical state "0," the away direction may indicate a logical state "1," and the logic output is typically bistable when one of the logic inputs is "1" and the other of the logic inputs is "0". The third fixed layer then re-writes the logic output to "1" when the logic output is bistable, so that the logic inputs and logic output satisfy NAND gate logic, or the third fixed layer re-writes the logic output to "0" when the logic output is bistable, so that the logic inputs and logic output satisfy NOR gate logic.

The present invention further discloses a plurality of the logic gates. A bipolar transistor or a CMOS pair connected to the STT triad output provides a fan out of the output, where one STT triad output may drive any number of other STT triad inputs. The STT triad may comprise any NAND or NOR element based logic circuit (e.g. 1-bit full adder).

BRIEF DESCRIPTION OF THE DRAWINGS

Referring now to the drawings in which like reference numbers represent corresponding parts throughout:

FIGS. 1(b)-(g) illustrate all six magnetization alignment ground states of the ferromagnetic triangle.

FIGS. 2(c)-(d) are schematics of two STT triads used as a non-volatile NAND gate, wherein each STT triad comprises a triangle shaped free layer shared between three spin transfer torque (STT) devices, a transistor pair serves to couple the output to an input of the next STT triad, the upper figure (FIG. 2(c)) is a top view of the two STT triads, the lower figure (FIG. 2(d)) is a side view of FIG. 2(c) showing the circuit connection between the output of one STT triad and one of the inputs of the second STT triad, and driving electronics are also shown.

FIG. 7(a) is top view of a full adder built up from several STT-triad unit cells and FIG. 7(b) is a side view of the STT-triad unit cell.

DETAILED DESCRIPTION OF THE INVENTION

Figure 1A:
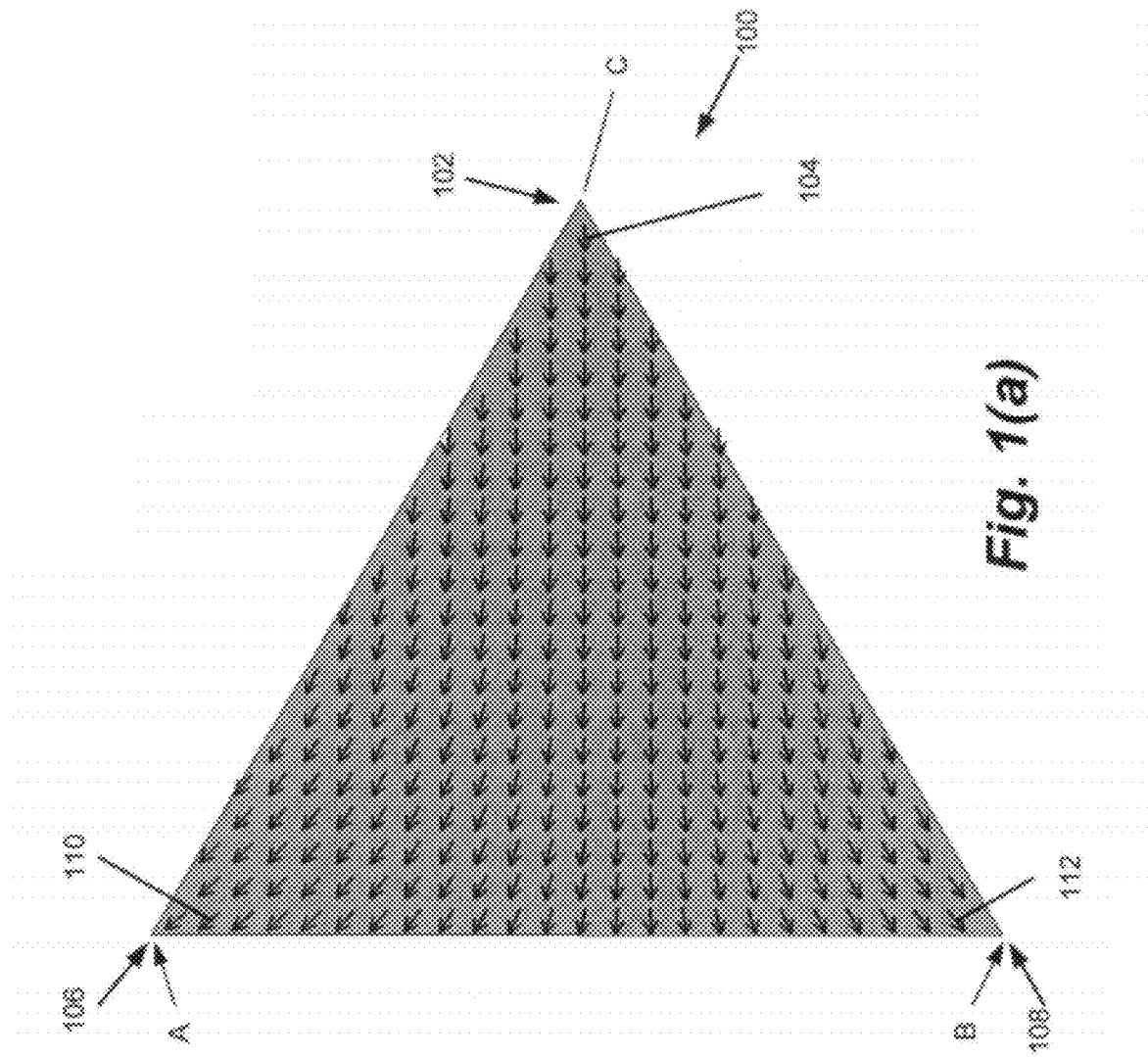
FIG. 1(a) illustrates a single magnetization alignment ground state in a 10 nanometer (nm) thick ferromagnetic equilateral triangle with a 100 nm long side (calculated by micromagnetic simulation)

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

One concept of the present invention is the separation of the read and write functions of the STT-MRAM, and connection of STT-MRAMs by a shared single domain magnet, thereby achieving non-volatile logic.

Strong shape induced magnetic anisotropy defines six different magnetization alignment ground states of a single domain ferromagnetic triangle. Local magnetization direction at the triangle vertices defines logical "0", pointing inwards, and logical "1" pointing outwards, from the vertices of the triangle. The present invention defines one vertex as the output and the other two vertices as inputs.

By controlling local magnetization alignment of two inputs, one of the triangle magnetic ground states is defined, with corresponding magnetization alignment of the third vertex, which serves as an output.

Each of the triad inputs may be controlled by a spin transfer torque device (STTD), or multiferroic cell (MC) driven by 2 transistors, for example. For input states (1, 1) and (0, 0), the output is 0 and 1, respectively. (1, 0) and (0, 1) input states result in the bi-stable output of either 0 or 1.

Current (voltage) initialization pulses clocked through the STTD placed over the output vertex, before or simultaneously with writing the inputs, so that the initialization pulse ends before the trailing edge of the write pulses, define the output to be "1" for all input combinations except (1,1) (which results in "0"), and therefore the logic gate exhibits NAND logical operation. In another embodiment, the output may be defined to be "0" for all input combinations except (0,0) (which results in "1"), so that the logic gate exhibits NOR gate logical operation.

The magnetoresistance effect in the STTD is used to read the output state, and also used to drive the input of the next triad in the logic circuit. The magnetization states are stable in time, and therefore the triad has "write" and "store" phases of operation. The triad device acts as a logic gate during the "write" phase, and as a memory element during the "store" phase. While the write time is defined by the STTD, the "store" phase is not limited in time. The triad device does not consume energy during the "store" phase.

TECHNICAL DESCRIPTION

Integrating magnetic elements into electronic circuits significantly expands the device capabilities by making them non-volatile. Non-volatile logic does not lose information when the power is turned off, does not require energy to store the information, and continues operation when the circuit is powered on again without an initialization process.

Switching between the triad ground states has been demonstrated by micromagnetic simulations.

Ground States of the Single Domain Ferromagnet

FIG. 1(a) shows a triangular shaped nanoscale ferromagnet 100, dominated by shape induced magnetic anisotropy, that may serve as a non-volatile NAND gate. Small enough to support a single domain, the local magnetizations of the isolated triangle may be found in six different configurations, one of which is shown in FIG. 1(a). Each magnetization alignment state is characterized by one of vertices 102 having the local magnetization 104 directed toward (or away from) that vertex 102 while the two other vertices 106, 108 have their local magnetizations 110, 112 directed away from (or towards) their respective vertices 106,108. Inputs to the logic gate are at vertices A and B of the ferromagnet 100, and the output from the logic gate is at vertex C of the ferromagnet 100.

FIGS. 1(b)-(g) show all 6 possible magnetization alignment ground states for the triangle shaped nanoscale ferromagnet 100, defined by the spin ice rule [5-6] wherein each ground state represents one of the possible logic states of the logic gate according to the present invention. The ferromagnet 100 has a triangular shape 114 having a side length 116 of less than 150 nm, or a size (e.g., area) that supports a single magnetic domain.

If the present invention defines a "1" as the local magnetization alignment 110 pointing away from a vertex 106 (inward), and "0" as the local magnetization alignment 104 pointing towards vertex 102 (outward), then the 6 magnetization alignment ground states enable NAND or NOR gate logic, as shown in Table 1 below.

Table 1 tabulates the 6 ground magnetization alignment ground states of the ferromagnet 100 when a first input to the logic gate defines a magnetization alignment at vertex A (hereinafter input A) and a second input to the logic gate defines a magnetization alignment at vertex B (hereinafter input B), wherein the magnetization alignment at vertex C (hereinafter output C) is determined from input A and B according to the spin ice rule and the logic output of the logic gate is also read from output C.

TABLE 1

| Input A | Input B | Output C | Output C Initialization (NAND Gate) | Output C Initialization (NOR Gate) |
| --- | --- | --- | --- | --- |
| 0 | 0 | 1 | 1 | 1 |
| 0 | 1 | 1 | Re-written to 1 | Re-written to 0 |
| 0 | 1 | 0 | | |
| 1 | 0 | 0 | Re-written to 1 | Re-written to 0 |
| 1 | 0 | 1 | | |
| 1 | 1 | 0 | 0 | 0 |

Table 1 shows that when input A is "0" and input B is "1", or when input A is "1" and input B is "0", the output at vertex C is bistable (i.e., "0" or "1"). This bistability allows the ferromagnet 100 to act as a NAND gate or a NOR gate. For NAND gate operation, the bistable ferromagnet output at vertex C is initialized or written to "1" when input A is "0" and input B is "1", and when input A is "1" and input B is "0". For NOR gate operation, the bistable ferromagnet output at vertex C is written or initialized to "0" when input A is "0" and input B is "1", and when input A is "1" and input B is "0".

Device Structure(s)

Figure 2A:
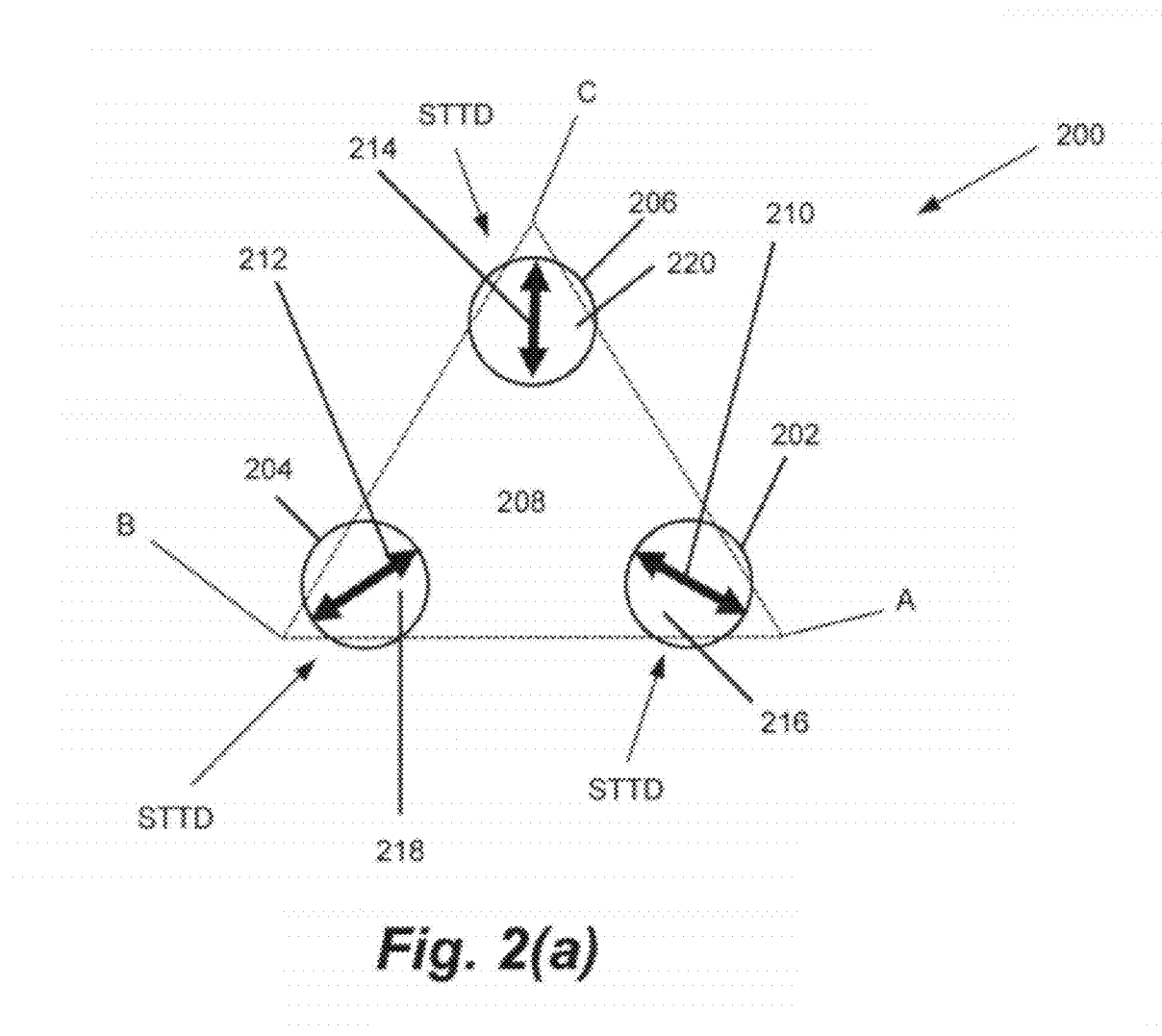
FIG. 2(a) is a schematic top view of an STT triad comprising a triangular shaped free layer and fixed layers coupled to the free layer.

FIG. 2(a) is a top view schematic of an STT triad 200 comprising three fixed layers 202, 204, 206 (in three STTDs or STT diodes) coupled by a single domain ferromagnet 208 (free layer). The STT triad 200 implements a scalable non-volatile logic gate and memory element. The ferromagnet 208 has a shape that is a triangle having three vertices A, B, and C. A first input to the logic gate is at vertex A (input A), a second input to the logic gate is at vertex B (input B), and an output of the logic gate is at vertex C (output C). The local magnetization alignment 210, 212 at the inputs A, B, and the triangular shape, cause a local magnetization alignment 214 at the output C, thereby demonstrating triad operation.

The free layer 208 has two input regions 216, 218 adjacent or in proximity to the vertices A, B, respectively, and an output region 220 adjacent or in proximity to the output vertex C, wherein the input regions 216, 218 and output region 220 are electrically isolated from each other by one or more electrical gaps, spatial separation, or because the regions 216-220 do not overlap, for example. The input regions 216, 218 and output region 220 have the local magnetization alignments 210, 212 and 214 towards or away from the vertices A, B, C, respectively.

The first fixed layer 202 is positioned on or above input region 216 at vertex A, the second fixed layer 204 is positioned on or above input region 218 at vertex B, and the third fixed layer 206 is positioned on or above output region 220 at vertex C of the ferromagnet 208, wherein (a) the first fixed layer 202 orients the first local magnetization alignment 210 so as to point the first local magnetization alignment 210 in a direction towards or away from the first vertex A, (b) the second fixed layer 204 orients the second local magnetization alignment 212 so as to point the second local magnetization alignment 212 in a direction towards or away from the second vertex B, and (c) the third fixed layer 206 orients a third local magnetization alignment 214 so as to point the third local magnetization alignment 214 in a direction towards or away from the third vertex C to initialize the logic gate as a NAND or NOR logic gate. The third fixed layer 206 also reads the logic output from the third local magnetization alignment 214 using the GMR effect.

Thus, the STT triad 200 may comprise three STTDs and a single domain magnet 208, wherein each of the STTDs comprises a fixed layer (e.g., 202, 204, or 206) and a portion (e.g., 216, 218, or 220) under the fixed layer 202, 204, 206. The three STTDs may be coupled by the single domain magnet 208.

Figure 2B:
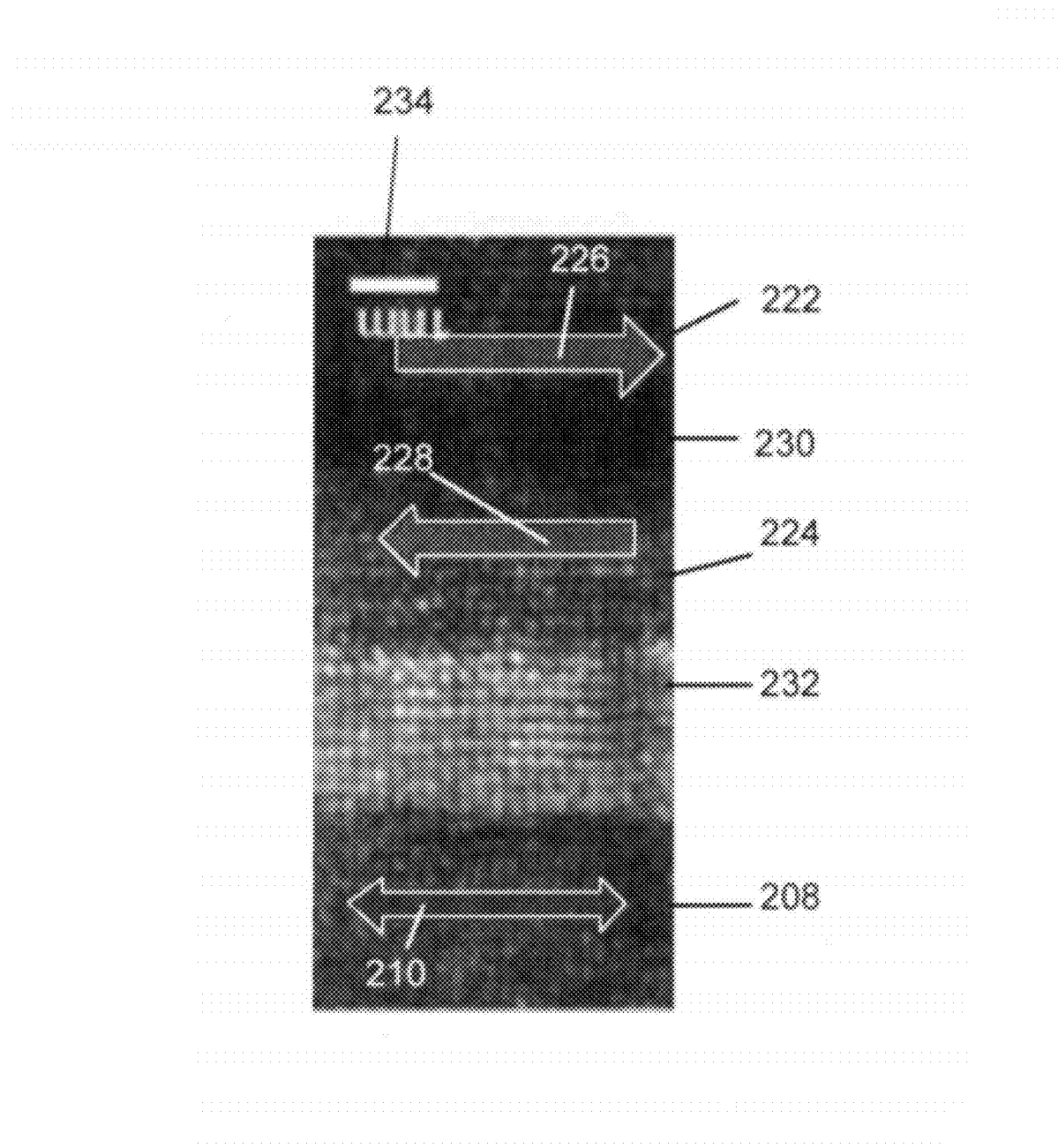
FIG. 2(b) is a transmission electron microscope (TEM) image of CoFe, CoFeB, Ru, and MgO layers, taken from [7], wherein the layers are one example of device layers that can be used to fabricate the STT triad of the present invention, so that FIG. 2(b) is a cross-section of the STT triad at the location of the fixed layers, and arrows show the magnetization alignment within the STT magnetic layers.

In one embodiment, each of the fixed layers 202-206 are synthetic antiferromagnets comprising two magnetically coupled ferromagnetic layers 222, 224 having fixed and antiparallel magnetic orientations 226 and 228, as shown in FIG. 2(b) [7]. One of the magnetically coupled layers 222 is a CoFe layer and the other magnetically coupled layer 224 is a CoFeB layer. The magnetically coupled layers 222 and 224 are separated and coupled by a Ruthenium (Ru) layer 230. FIG. 2(b) also shows the free layer ferromagnet 208 that is a CoFeB layer. The CoFeB ferromagnet 208 is separated from the ferromagnetic layers 222, 224 of the synthetic antiferromagnet by an MgO spacer layer 232. The scale 234 in FIG. 2(b) is 1 nm. Thus, FIG. 2(b) is a cross-section of the STT triad 200 at the location of the fixed layers 202-206.

The STTDs comprising fixed layers 202-206 may be about 100 nanometers (nm) in diameter or less. For example 10-20 nm diameter STT pillars comprising layers 202-206 may be positioned on the triangular free layer 208, wherein the triangular free layer 208 may have a side that is 50 nm long. The size of the STTDs may scale with the triangular free layer's 208 dimensions. However, the present invention is not limited to any particular dimensions for the STTDs comprising fixed layers 202-206, the free layer 208, or the STTD triad 200.

STT triads 200 may be connected together. FIG. 2(c) is a top view schematic of two single domain ferromagnets 208, 236 integrated with a CMOS pair of transistors 238. In the second ferromagnet 236, inputs are at vertices A' and B' (input A' and input B'), and the output is at vertex C' of the triangle (output C'). The circuit connection (using transistors 238) is between the output C of the first ferromagnet 208 and one of the inputs A' of the second ferromagnet 236, although other circuit connections are possible.

FIG. 2(d) is a side-view of FIG. 2(c), showing the second STT triad 240 comprises fixed layers 242 and the STT triads 200, 240 may have one or more electrical gaps 244 to electrically isolate the input regions 216, 218 and output region 220.

Clocking

FIG. 2(c) and FIG. 2(d) also show clocking of the ferromagnet(s) 208. Each vertex A,B,C, A',B',C' of each STT triad 208, 240 is clocked using clocking pulses through fixed layer (e.g., 202-206) deposited on input regions 216-220 at the vertices A-C. The logic state "0" or "1" is supplied or clocked by pulsed voltages $V_{DD}^+$ and $V_{SS}^-$ that produce a current through the STTD that reorients the magnetization alignments 210, 212 and 214 of the free layer 208 with respect to the fixed layers 202-206. Specifically, it is the direction of the current flow between each of the fixed layers 202-206 and the free layer 208 that fixes the magnetization alignment 210, 212, 214 of free layer 208 with respect to each of the fixed layers 202-206. For example, a spin polarized current (a current comprising electrons having predominantly one spin orientation) reorients the free layer's 208 local magnetization alignment 210 to be parallel or anti parallel to the fixed layer's 224 magnetization 228 as the electrons in the spin polarized current flow from the fixed layer 202 to the input region 216 of free layer 208, or from the input region 216 of free layer 208 to fixed layer 202, respectively. Similarly, spin polarized current reorients local magnetization alignment 212 in input region 218 to be parallel or anti parallel to the fixed layer's 224 magnetization alignment 228, as current flows between input region 218 and fixed layer 204, and spin polarized current reorients or reads local magnetization alignment 214 in output region 220 as parallel or anti parallel to the fixed layer's 224 magnetization alignment 228 as current flows between output region 220 and fixed layer 206.

Logic state "1" is represented by the local magnetization alignments 210, 212, 214 pointing away or outwards from vertices A, B, C, respectively, and logic state "0" is represented by the local magnetization 210, 212, 214 pointing inwards or towards vertices A, B, or C, respectively.

According to the ground states of the ferromagnet 100, 208, the output vertex C is "1" if (A,B)=(0,0) (as shown in FIG. 1(g)) and the vertex C is "0" if (A,B)=(1,1) (as shown in FIG. 1(b)). In both these cases ((A,B)=(0,0) or (1,1)), the internal fields (e.g., local magnetization alignment 214) overcome the output clock pulses from the fixed layers 212.

However, if (A,B)=(0,1) or (1,0), the output C appears ambiguous or bistable. Specifically, there are two ground states representing (A,B)=(0,1), one giving output "1" and the other output "0" (see FIGS. 1(d) and 1(c)), and two ground states representing (A,B)=(1,0), one giving output "1" and the other output "0" (see FIGS. 1(f) and 1(e)).

The bistability allows the present invention to achieve logic NAND or logic NOR by initializing the orientation of magnetization alignment 214 at the output vertex C. Specifically, this ambiguity or bistability is relieved during clocking of positive supply voltage $V_{DD}^+$ and negative supply voltage $V_{SS}^-$ to the output vertex C. For NAND gate operation, vertex C is clocked to "1" unless the inputs (A,B)=(1,1). For (A,B)=(1,1) or (0,0), the internal fields 214 is sufficient to overcome the reset pulse at the output vertex C and the output vertex is set to "0" or "1", according to FIGS. 1(b) and 1(g).

For a NOR gate implementation, the opposite initialization is used: vertex C is clocked to "0" unless the inputs (A,B)=(1,1).

In the quiescent state no power is drawn in the ferromagnet 208. During a single clock cycle, the ferromagnet 208, 236 is energized and the state of the ferromagnet 208, 236 is switched. At the same time, a transistor 238 pair is clocked on, and the appropriate current is delivered to the next stage STTD 242 at input vertex A' of ferromagnet 236. The current to the next stage 244 is determined by the limiting resistor Rc, and fan-out is limited only by the current drive that can be delivered by the transistor 238 pair. When the resistance of the output spin torque device (comprising fixed layer 206, free layer region 220, and spacer (e.g., 232) between the free layer region 220 and fixed layer 206) is greater than, or less than, the resistance of load resistor $R_L$, the CMOS pair 238 draws current in the fixed layer of STTD 242 in the positive or negative direction respectively, reorienting the magnetization alignment 246 of the free layer 236 near the vertex A' of the next triad STTD 240, as shown in FIG. 2(d).

Timing Scheme

Figure 3:
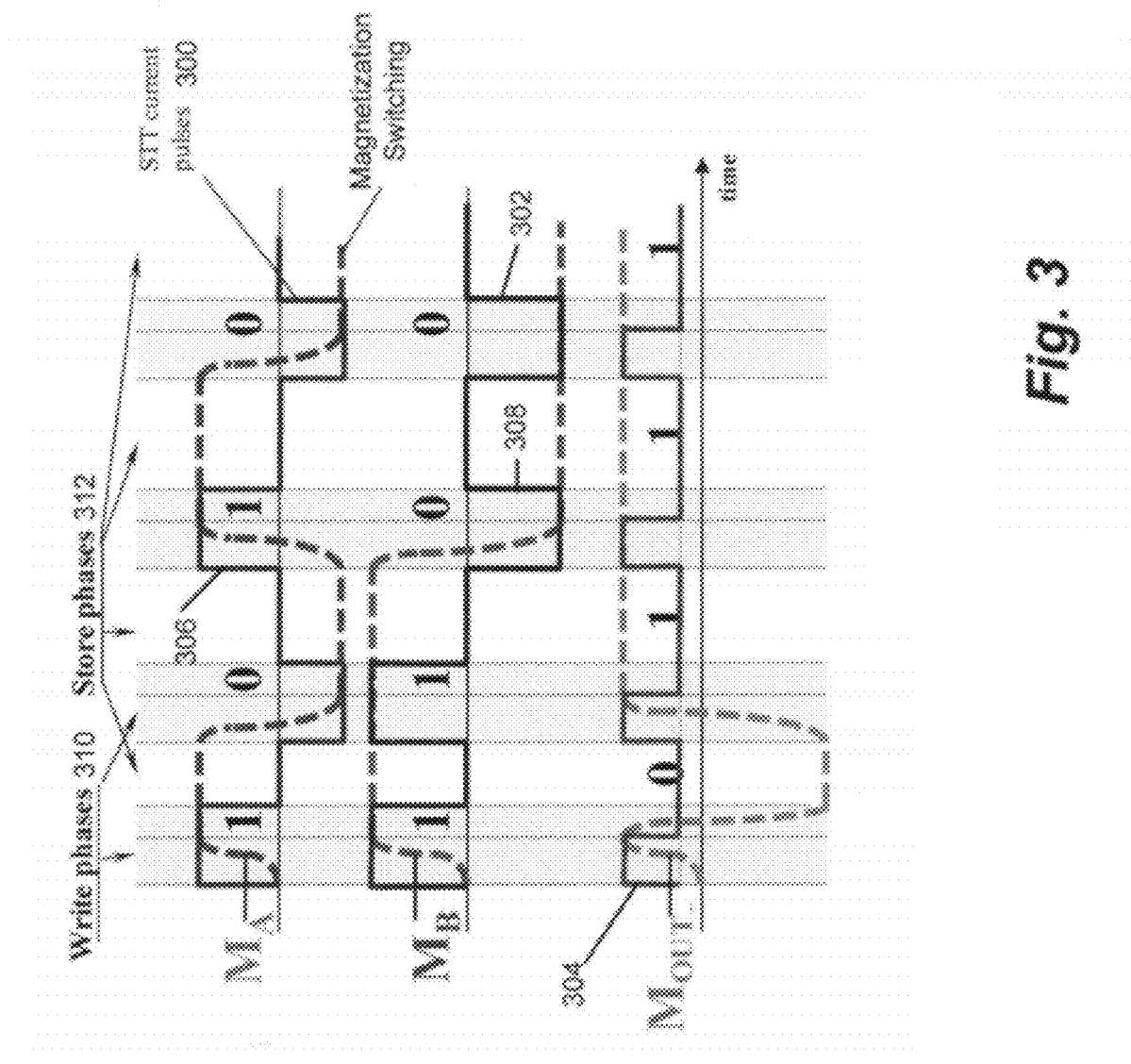
FIG. 3 illustrates writing, reading, and initialization pulses used in magnetization switching of the logic gate of the present invention.

FIG. 3 is a graph illustrating the timing of the clocking pulses 300, 302, and 304 to obtain the NAND gate of the present invention. The logic gate (ferromagnet 100, 208) produces at least one logic output from the logic inputs using the shape induced magnetic anisotropy when the logic inputs include concurrent writing pulses 300, 302 (STT current pulses) to switch the magnetization alignments $M_A$ and $M_B$ (magnetization switching) in each of the input regions 216 and 218, wherein a positive writing pulse 306 represents logic state "1" and a negative writing pulse 308 represents logic state "0". The output region receives initialization pulses 304 to align the output magnetization $M_{out}$ (selecting one of the bistable ground states illustrated in FIGS. 1(c),(d),(e) and (f)) in the output region 220 and initialize the logic gate as a NOR gate or NAND gate. The initialization pulses 304 are received by the output region each time the logic gate receives the writing pulses 300-302. The initialization pulses 304 may begin at a same time as the writing pulses 300-302, are shorter than the writing pulses 300-302, and the magnetization alignment $M_{out}$ in the output region 220 is initialized by a trailing edge of the initialization pulses 304. Alternatively, the initialization pulses 304 can initialize the output before the writing pulses 300-302 are clocked—the triad then will stay initialized until the inputs are written.

When the initialization pulses 304 are positive, the logic gate is a NAND gate. However, when the initialization pulses 304 are negative, the logic gate is a NOR gate. The write phases 310 (shaded region) may comprise a short~1 nanosecond (ns) long pulse 300, and the triad relaxation is scalable with triad dimensions—for a 50 nm side triad, the relaxation time may be 150 picoseconds (ps). During the store phases 312 (white regions), the triad stores the input and output states with no time limit and with no energy consumption.

ADVANTAGES AND IMPROVEMENTS

The present invention adds non-volatility to the existing logic devices and logic operation capability to the memory capability of magnetic devices. This leads to lower power consumption, better scalability, and non volatility. Using STT to implement logic as well as store information, replaces and reduces the transistor count.

Features of this STTD triad and transistor 238 pair include:
1. Integrated logic and memory.
2. Easy implementation in existing technology, using e.g., sputter deposited magnetic films and lithography for patterning.
3. The triad is non-volatile and is energized from the power off state by pulsing $V_{DD}$ and $V_{SS}$. There is no power dissipation in the quiescent state.
4. Micro-magnetic simulations indicate that the relaxation of the STT triad free layer to one of its ground states is faster than state-of-the-art STT junctions.
5. The power and/or energy per operation and time per operation of this nonvolatile logic is determined essentially by switching power of the STTD.
6. NAND or NOR Operation.

Possible Modifications and Variations

Figure 4:
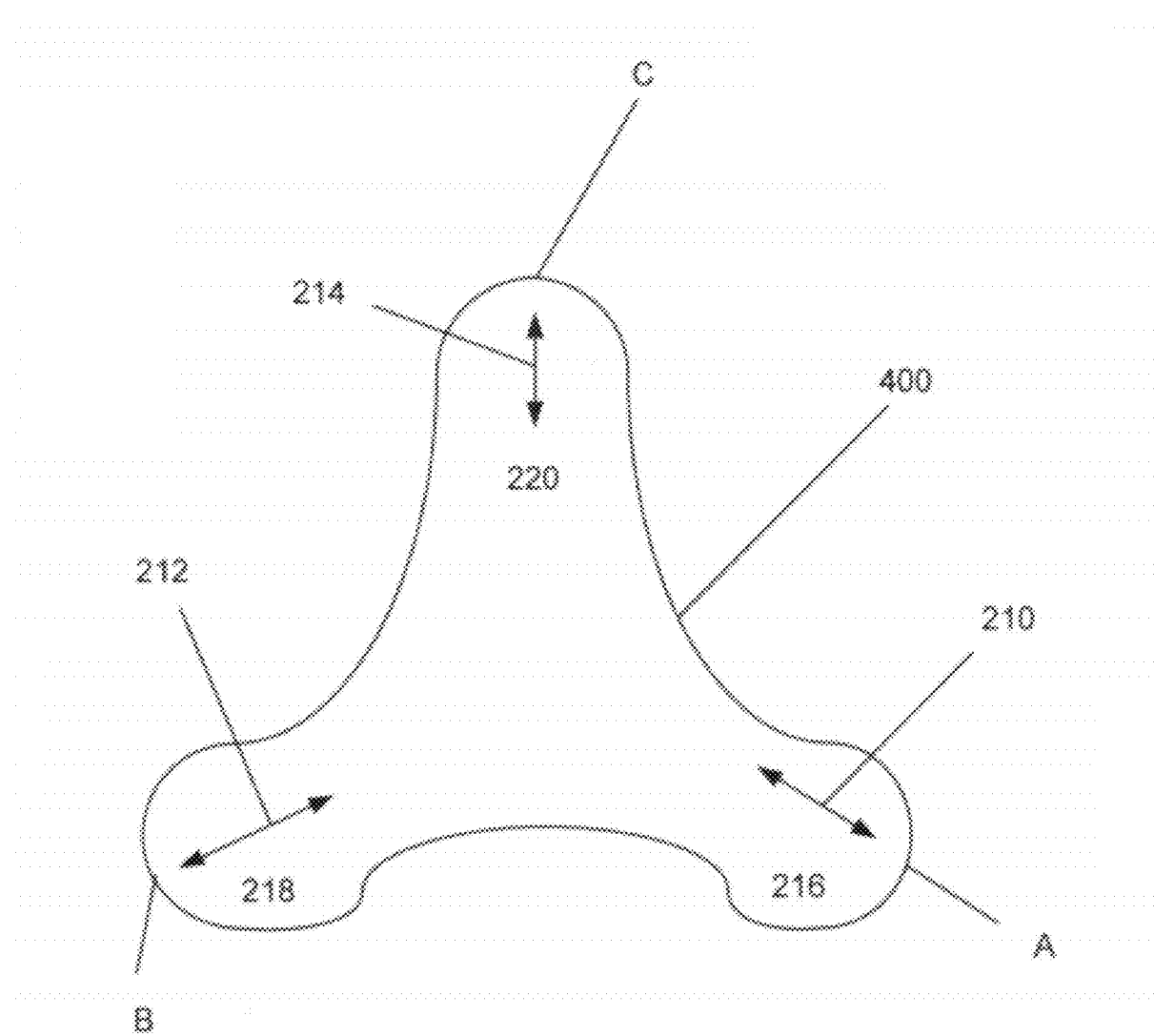
FIG. 4 is top view of a shaped ferromagnet having three vertices and curved sides.

FIG. 4 shows an embodiment wherein the shape does not have straight sides 400 connecting the vertices A, B, C.

Figure 5:
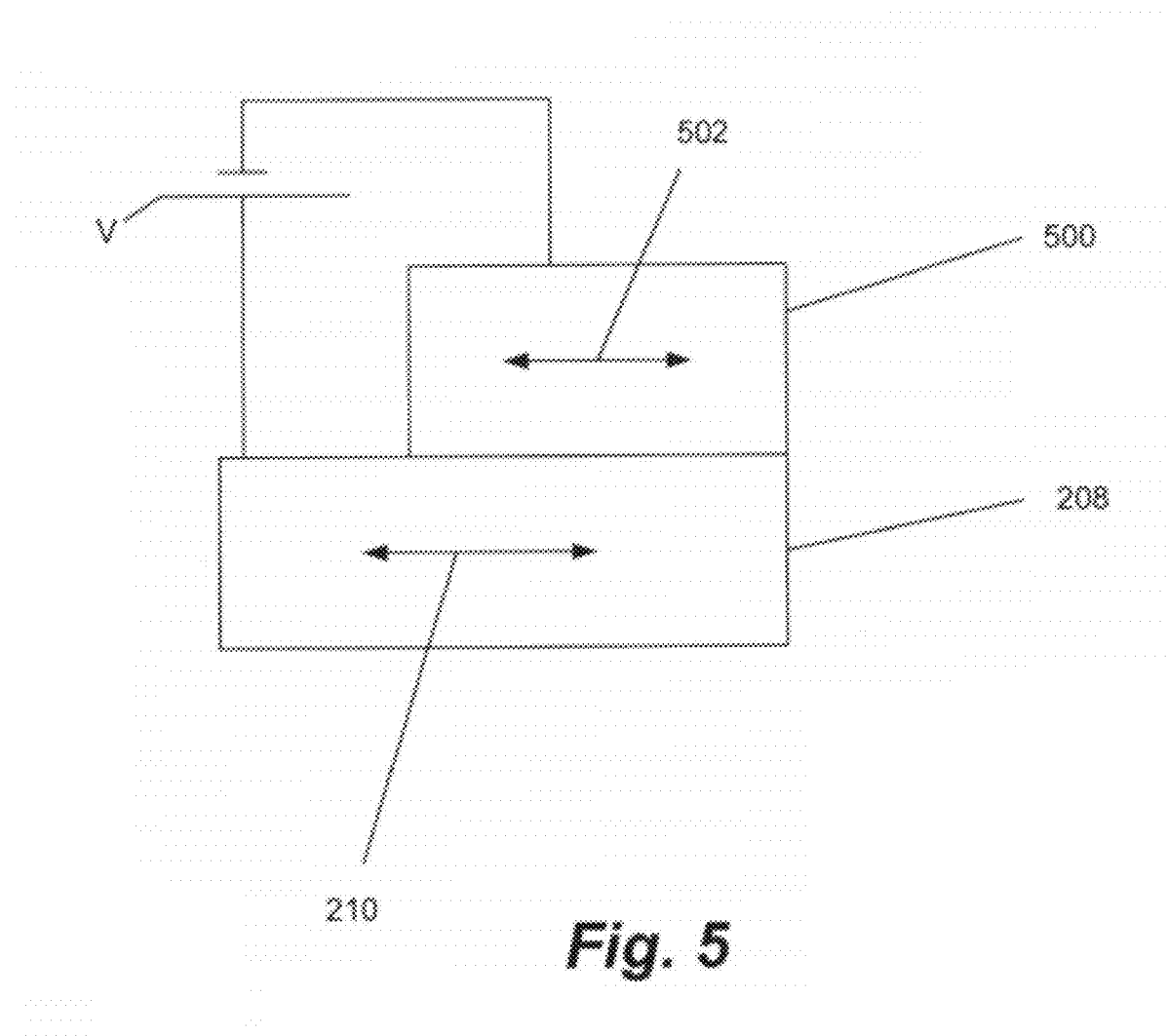
FIG. 5 is a cross-sectional schematic showing a multiferroic element used to control the magnetization alignment of a free layer.

Switching the input states of the ferromagnet 208 can also be performed by other means, for example, by using exchange bias coupling to multiferroic (MC) elements 500 on triad vertexes A-C, as shown in FIG. 5. The difference between the spin torque based and multiferroics based triad, is that the former uses current for switching, while the latter uses voltage V. A voltage V applied to the MC element 500 orients the magnetization 502 of the MC element which in turn orients the magnetization alignment 210 in the free layer 208. While the latter (MC element) has a power advantage, the former (STTD) would probably have a performance advantage because of the faster triad 200 input switching time (1 ns).

Process Steps

Figure 6:
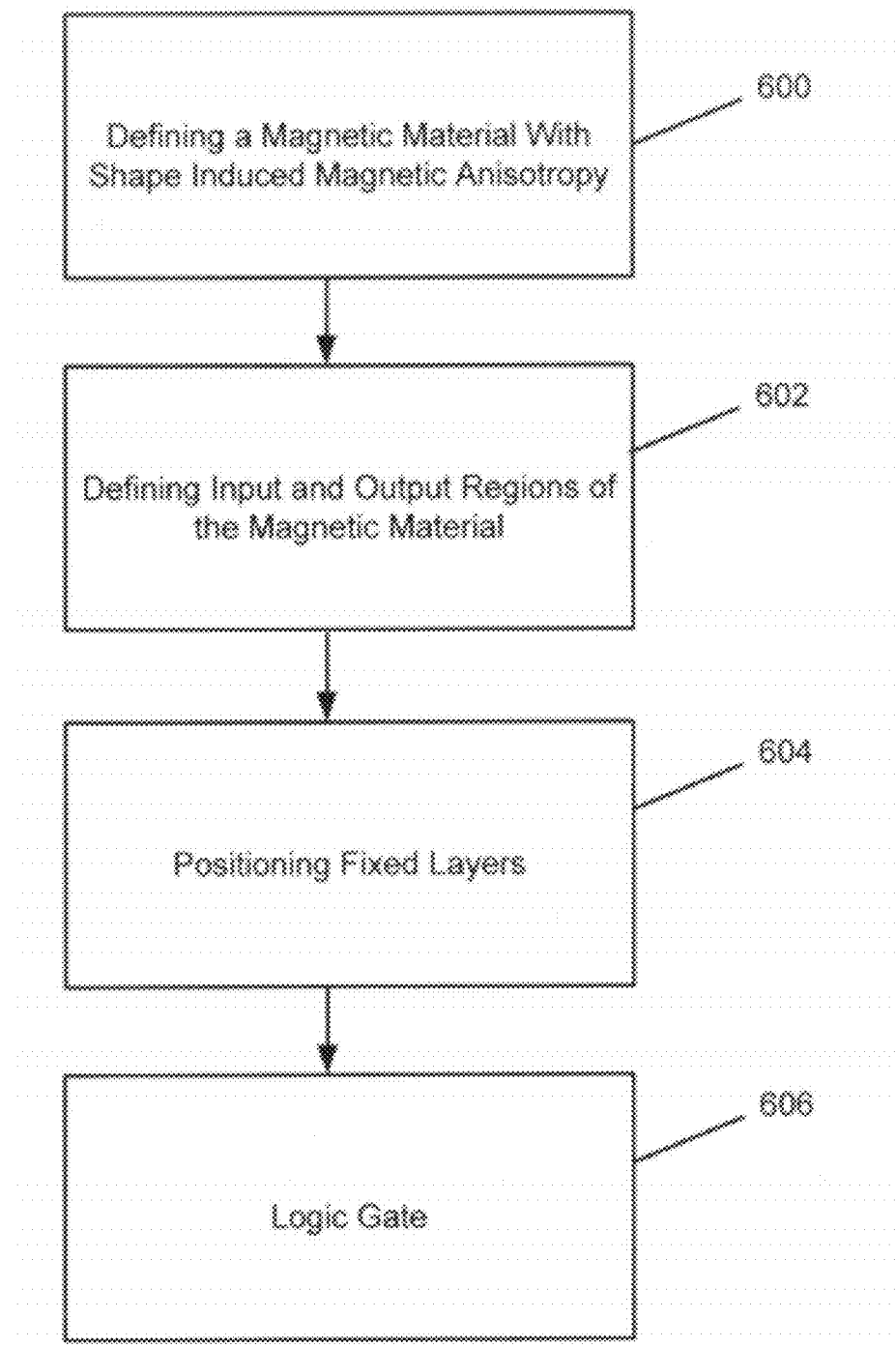
FIG. 6 is a flowchart illustrating a method of fabricating a non-volatile logic gate according to the present invention.

FIG. 6 is a flowchart illustrating a method of fabricating a non-volatile logic gate, comprising a magnetic material. The method may comprise the following steps (referring also to FIGS. 1(a)-(g), FIGS. 2(a)-(d)), FIGS. 3-4.

Block 600 represents selecting the magnetic material, and defining or shaping the magnetic material into a shape that induces magnetic anisotropy in the magnetic material, wherein the shape has a first vertex A, a second vertex B, and a third vertex C, and supports or provides a single magnetic domain.

The magnetic material may be a ferromagnet or ferrimagnet at a temperature of operation of the logic gate, for example. Materials for the ferromagnet include, but are not limited to, Iron/Cobalt, permalloy (Ni/Fe), or CoTaZr. The magnetic material is typically metallic/conducting.

The step may comprise defining a size of the magnetic material (e.g., dimensions 116 and/or area of the triangle) that supports the single magnetic domain.

The shape may be a triangle, e.g., an isosceles, equilateral, or scalene triangle, for example. In other embodiments, the shape may not have straight sides (e.g., may have curved sides 400) connecting the vertices A, B, C. The curved sides may be concave, for example.

The shape induced magnetic anisotropy may determine at least part of a truth table for the logic gate, so that the logic gate produces the at least one logic output from the logic inputs using the shape. The shape may be such that the truth table describes NAND gate logic or NOR gate logic for the logic gate.

The shape may be such that local magnetization alignments 210, 212, 214 at each of the vertices obey the spin ice rule.

Bistability allows NAND or NOR operation depending on initialization or definition of the output of the logic gate. The shape geometrically frustrates the magnetic material so that a magnetization alignment 214 at the third vertex C is bistable when one of the logic inputs is "0" and the other of the logic inputs is "1", enabling the logic gate to be initialized as either a NAND gate or a NOR gate.

Block 602 represents defining regions of the magnetic material including a first input region 216 adjacent or proximate to the first vertex A, a second input region 218 adjacent or proximate to the second vertex B, and an output region 220 adjacent or proximate to the third vertex C, wherein the first input region 216 is for receiving a first logic input (e.g., logical "0" or "1") to the logic gate, the second input region 218 is for receiving a second logic input (e.g., logical "0" or "1") to the logic gate, and the output region 220 is for outputting at least one logic output (e.g., logical "0" or "1") of the logic gate.

The first input region 216 may completely cover the first vertex A, the second input region 218 may completely cover the second vertex B, and the output region 220 may completely cover the third vertex C, but the regions 216-220 typically do not overlap each other.

The first input region 216, the second input region 218, and the output region 220 may, or may not, be electrically isolated from each other. If the regions 216-220 are isolated, an electrical gap 244 may be between each of the regions 216-220. Sizes of the input regions 216-218 and output region 220 may be such that current in one of the regions 216-220 does not affect current in another of the regions 216-220.

The first input region 216 typically has a first local magnetization alignment 210 defined by the first logic input, the second input region 218 typically has a second local magnetization alignment 212 defined by the second logic input, and the output region 220 typically has a third output magnetization alignment 214 that defines the logic output.

The shape may be such that there are exactly six energy equivalent combinations (six stable configurations) for the directions of the first local magnetization alignment 210, the second magnetization alignment 212, and the output local magnetization alignment 214. The six energy equivalent combinations may correspond to six energy equivalent energy states determined by a spin ice rule. The switching energy of the local magnetization alignments 210-214 is typically sufficiently stable to operate as non-volatile logic.

The shape may be such that two of the local magnetization alignments 210-214 point away from their respective vertices A, B, C and one of the local magnetization alignments 210-214 points towards its respective vertex A, B or C, or one of the local magnetization alignments points 210-214 away from its respective vertex A, B, or C, and two of the local magnetization alignments 210-214 point towards their respective vertices A, B, C.

Block 604 represents positioning fixed layers 202-206 to form an STT triad 200 including a first fixed layer 202, a second fixed layer 204, and a third fixed layer 206 coupled by a single free layer, wherein the single free layer is the magnetic material (e.g., ferromagnet 208). The step may comprise depositing one or more spacer layers 232 to separate the fixed layers 202-206 from the free layer 208 such that the fixed layers 202-206 are electrically coupled to the free layer 202. Each fixed layer 202-206 along with the portion (e.g., 216, 218, 220) of the free layer 208 under it forms an STTD or a STT diode.

Typically, there should not be a magnetic coupling between the fixed layers 202-206 and the free layer 208, so the free layer's 208 magnetization alignment 210-214 can move freely; the free layer's 208 magnetization alignment 210-214 should not be pinned by the any magnetic fields associated with the fixed layers 202-206. In the embodiment of FIG. 2(b), to reduce the magnetic fields from the fixed layers 202-206, the fixed layers 202-206 comprise of two antiferromagnetically aligned magnets 222, 224 separated by layer 230. The STTD is formed by the magnetic film 224 in close proximity to the free layer 208. The magnetic film 222 nullifies the magnetic field from the magnetic film 224 without influencing the spin transfer torque (STT) caused by the current flow from layer 224 to the free layer 208, as shown in FIG. 2(b). Thus, in the embodiment of FIG. 2(b), only one of the magnetic films (layer 224) in the antiferromagnetically coupled pair actually participates in the STT action, the transfer of magnetization by spin transfer. The film (layer 222) not in proximity to the free layer 208 simply cancels out the fringing fields from the magnetic field used for the STT.

The first fixed layer 202 is positioned to provide the first logic input via writing pulse 300 that orients the first local magnetization alignment 210 so as to point the first local magnetization alignment 210 in a direction towards or away from the first vertex A.

The second fixed layer 204 is positioned to provide the second logic input via writing pulse 302 that orients the second local magnetization alignment 212 so as to point the second local magnetization alignment 212 in a direction towards or away from the second vertex B.

The third fixed layer 206 is positioned to provide an initialization pulse 304 that orients the third local magnetization alignment 214 so as to point the third local magnetization alignment 214 in a direction towards or away from the third vertex C, to define the truth table describing NAND or NOR logic. The third fixed layer 206 is also positioned to read the logic output using the GMR effect.

In one embodiment, the towards direction may be defined indicate a logical state "0," the away direction may indicate a logical state "1," and the logic output is bistable when one of the logic inputs is "1" and the other of the logic inputs is "0". In this case, and when the logic output is bistable, the fixed layer 206 may re-write the logic output to "1" so that the logic inputs and logic output satisfy NAND gate logic. Alternatively, the fixed layer 206 may re-write the logic output to "0" when the logic output is bistable, so that the logic inputs and logic output satisfy NOR gate logic.

Block 606 represents the end result of the method, a logic gate. The logic gate may comprise a triad 200 of one or more fixed layers 202-206 coupled by a single domain ferromagnet 208. The step may comprise connecting a plurality of the logic gates 208, for example, wherein one or more transistors 238 electrically couple the output of one of the logic gates to one of the inputs of another of the logic gates.

The present invention may use transistors 238 to perform read-write functionality, while the magnetic material of the present invention performs the logic. The transistors 238 may form a CMOS pair, for example, that reads the triad output at vertex C and writes it to another triad input at input A'. The plurality of logic gates and the transistors may form a full adder, for example, as shown in FIG. 7.

Figure 7A:
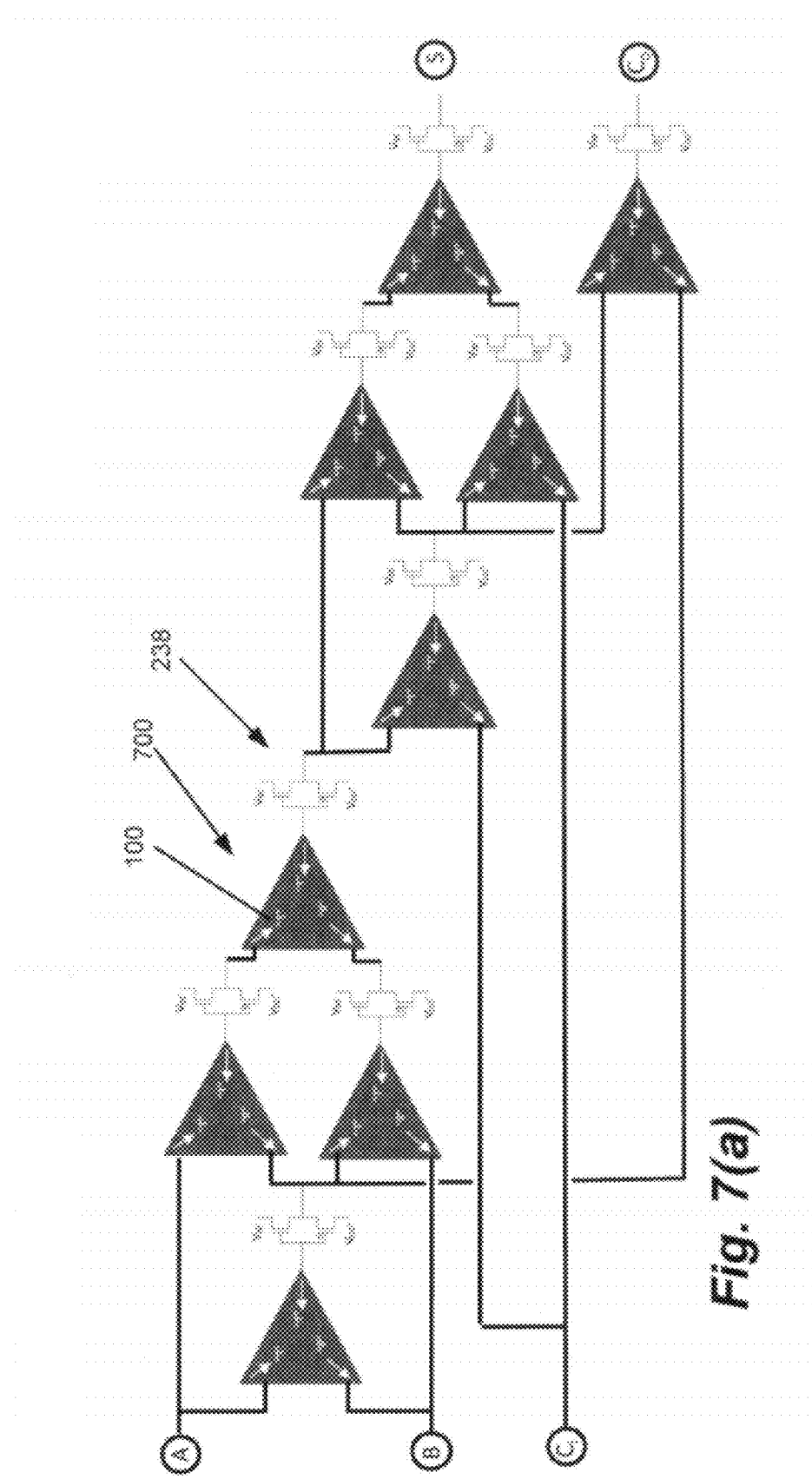

FIG. 7(a) is top view of a full adder built up from several STT-triad unit cells 700 comprising the ferromagnet 100 and CMOS pair 238. The full adder has inputs A, B and Carry In ($C_{in}$), and outputs Sum (S) and Carry Out ($C_o$). FIG. 7(b) is a side view of the STT-triad unit cell 700.

FIGS. 1-6 also illustrate a method for implementing a non-volatile logic gate, comprising obtaining a magnetic material having a shape induced magnetic anisotropy, wherein a shape of the magnetic material has a first vertex, a second vertex, and a third vertex and supports a single magnetic domain and regions of the magnetic material include a first input region adjacent the first vertex, a second input region adjacent the second vertex, and an output region adjacent a third vertex; writing a first logic input to the first input region and a second logic input to the second input region, initializing the logic gate as a NAND gate or as a NOR gate; and outputting at least one logic output from the output region, wherein the shape induced magnetic anisotropy determines at least part of a truth table for the logic gate, so that the logic gate produces the at least one logic output from the logic inputs using the shape.

REFERENCES

The following references are incorporated by reference herein.

[1] R. Coehoorn, "Giant magnetoresistance and magnetic interactions in exchange-biased spin-valves", Handbook of Magnetic Materials, vol. 15, ed. K.H.J. Buschow, Elsevier, Amsterdam (2003); L. L. Hinchey and D. L. Mills, "Magnetic properties of superlattices formed from ferromagnetic and antiferromagnetic materials". Physical Review B 33, 3329 (1986).

[2] Ralph, D. C., M. D. Stiles "Spin transfer torques". Journal of Magnetism and Magnetic Materials, 320, 1190 (2008).

[3] J. C. Slonczewski, "Current-driven excitation of magnetic multilayers", J. Magn. Magn. Mater. 159, L1 (1996).
[4] Larkhoon Leem, James S. Harris, "Magnetic coupled spin-torque devices for nonvolatile logic applications," J. Appl. Phys., 105(7), 07D102-5 (2009).
[5] S. T. Bramwell and M. J. P. Gingras, "Spin ice state in frustrated magnetic pyrochlore materials," Science 294 (5546), 1495-1501 (2001).
[6] M. J. Harris, S. T. Bramwell, D. F. McMorrow, T. Zeiske, and K. W. Godfrey, Phys. Rev. Lett. 79, 2554 (1997).
[7] S. Ikeda, J. Hayakawa, Y. M. Lee, F. Matsukura, Y. Ohno, T. Hanyu and H. Ohno, "Magnetic Tunnel Junctions for Spintronic Memories and Beyond", IEEE Trans Elec. Dev. 54, 991 (2007).
[8] Power Point Presentation by Alexander Kozhanov entitled "Spin Torque Triad", presented at the Nanoelectronics Research Initiative Annual Review, on Oct. 27, 2010, Washington, D.C.
[9] Larkhoom Leem and James S. Harris, "Magnetic Coupled Spin Torque Devices and Magnetic Ring Oscillator".
[10] Dmitri E. Nikonov, George I. Bourianoff, Tahir Ghani "Proposal of a spin torque majority gate logic", arXiv: 1006.4663v1 [cond-mat.mes-hall].

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A non-volatile logic gate, comprising:
    a magnetic material having a shape induced magnetic anisotropy, wherein a shape of the magnetic material has a first vertex, a second vertex, and a third vertex and supports a single magnetic domain;
    regions of the magnetic material including a first input region adjacent the first vertex, a second input region adjacent the second vertex, and an output region adjacent a third vertex;
    the first input region for receiving a first logic input to the logic gate, the second input region for receiving a second logic input to the logic gate, and the output region for outputting at least one logic output of the logic gate; and
    the shape induced a magnetic anisotropy determining at least part of a truth table for the logic gate, so that the logic gate produces the at least one logic output from the logic inputs using the shape.

2. The logic gate of claim 1, wherein the shape is a triangle.

3. The logic gate of claim 2, wherein the triangle is an isosceles triangle.

4. The logic gate of claim 2, wherein the triangle is a scalene triangle.

5. The logic gate of claim 1, wherein the shape has curved sides connecting the vertices.

6. The logic gate of claim 5, wherein the curved sides are concave.

7. The logic gate of claim 1, wherein the shape is such that the truth table defines the logic gate as a NAND gate or a NOR gate.

8. The logic gate of claim 7, wherein the shape imparts bistability to the logic gate that enables the logic gate to be initialized as either the NAND gate or the NOR gate.

9. The logic gate of claim 1, wherein the shape is such that local magnetization alignments in the magnetic material at each of the vertices obey a spin ice rule.

10. The logic gate of claim 1, wherein the first input region, the second input region, and the output region are electrically isolated from each other.

11. The logic gate of claim 1, wherein the first input region has a first local magnetization alignment defined by the first logic input, the second input region has a second local magnetization alignment defined by the second logic input, and the output region has a third output magnetization alignment that defines the logic output and which is initialized to define the logic gate as a NAND gate or a NOR gate.

12. The logic gate of claim 11, wherein the logic gate produces the at least one logic output from the logic inputs using the shape when:
    the logic inputs include concurrent writing pulses that switch the first local magnetization alignment and the second local magnetization alignment, wherein the writing pulse that is positive represents logic state "1" and the writing pulse that is negative represents logic state "0"; and
    the output region receives initialization pulses that align the third output magnetization to initialize the logic gate as the NOR gate or the NAND gate, each time the logic gate receives the writing pulses, wherein:
    (1) the initialization pulses begin at a same time as the writing pulses or the initialization pulses begin earlier than the writing pulses,
    (2) the initialization pulses are shorter than the writing pulses, and
    (3) the logic gate is initialized by a trailing edge of the initialization pulse.

13. The logic gate of claim 12, wherein when the initialization pulses are positive, the logic gate is a NAND gate, and when the initialization pulses are negative, the logic gate is a NOR gate.

14. The logic gate of claim 11, further comprising:
    a first fixed layer, a second fixed layer, and a third fixed layer coupled by a single free layer, wherein the single free layer is the magnetic material, and
    one or more spacer layers separating the fixed layers from the free layer such that the fixed layers are electrically coupled to the free layer.

15. The logic gate of claim 14, further comprising:
    (a) the first fixed layer providing the first logic input that orients the first local magnetization so as to point the first local magnetization in a direction towards or away from the first vertex;
    (b) the second fixed layer providing the second logic input that orients the second local magnetization so as to point the second local magnetization in a direction towards or away from the second vertex; and
    (c) the third fixed layer providing an initialization pulse that orients the third local magnetization so as to point the third local magnetization in a direction towards or away from the third vertex to define the truth table that defines the logic gate as the NAND or NOR gate.

16. The logic gate of claim 15, wherein the third fixed layer is positioned to read the logic output using a Giant Magneto Resistance effect.

17. The logic gate of claim 15, wherein:
the towards direction indicates a logical state "0," the away direction indicates a logical state "1," the logic output is bistable when one of the logic inputs is "1" and the other of the logic inputs is "0",
the third fixed layer re-writes the logic output to "1" when the logic output is bistable, so that the logic gate is the NAND gate, or
the third fixed layer re-writes the logic output to "0" when the logic output is bistable, so that the logic gate is the NOR gate.

18. The logic gate of claim 11, wherein the shape is such that there are exactly six energy equivalent combinations for the directions of the first local magnetization, the second magnetization, and the output local magnetization.

19. The logic gate of claim 11, wherein the shape is such that two of the local magnetizations point away from their respective vertices and one of the local magnetizations points towards its respective vertex, or one of the local magnetizations points away from its respective vertex and two of the local magnetizations point towards their respective vertices.

20. The logic gate of claim 11, wherein the magnetizations are aligned by a multiferroic element.

21. The logic gate of claim 1, wherein the magnetic material is a ferromagnet at a temperature of operation of the logic gate.

22. The logic gate of claim 1, further comprising:
a plurality of the logic gates; and
one or more transistors electrically coupling the output of one of the logic gates to one or more of the inputs of another of the logic gates.

23. The logic gate of claim 22, wherein the transistors form a CMOS pair.

24. The logic gate of claim 22, wherein the plurality of logic gates and the transistors comprise a full adder.

25. A method of fabricating a non-volatile logic gate, comprising:
shaping a magnetic material having shape induced magnetic anisotropy, wherein a shape of the magnetic material has a first vertex, a second vertex, and a third vertex and supports a single magnetic domain; and
defining regions of the magnetic material including a first input region adjacent the first vertex, a second input region adjacent the second vertex, and an output region adjacent a third vertex; wherein:
the first input region receives a first logic input to the logic gate, the second input region receives a second logic input to the logic gate, and the output region output at least one logic output of the logic gate; and
the shape induced magnetic anisotropy determines at least part of a truth table for the logic gate, so that the logic gate produces the at least one logic output from the logic inputs using the shape.

26. A method for implementing a non-volatile logic gate, comprising:
obtaining a magnetic material having a shape induced magnetic anisotropy, wherein
(1) a shape of the magnetic material has a first vertex, a second vertex, and a third vertex and supports a single magnetic domain, and
(2) regions of the magnetic material include a first input region adjacent the first vertex, a second input region adjacent the second vertex, and an output region adjacent a third vertex;
writing a first logic input to the first input region and a second logic input to the second input region,
initializing the logic gate as a NAND gate or as a NOR gate; and
outputting at least one logic output from the output region, wherein the shape induced magnetic anisotropy determines at least part of a truth table for the logic gate, so that the logic gate produces the at least one logic output from the logic inputs using the shape.

\* \* \* \* \*

UNITED STATES PATENT AND TRADEMARK OFFICE
CERTIFICATE OF CORRECTION

PATENT NO.        : 8,198,919 B1
APPLICATION NO.   : 13/033347
DATED             : June 12, 2012
INVENTOR(S)       : Alexander Kozhanov, S. James Allen and Christopher Palmstrom Page 1 of 1

It is certified that error appears in the above-identified patent and that said Letters Patent is hereby corrected as shown below:

On the Title Page

Item (73) Assignee:

Please change the name "The Regengs of the University of California" to read --The Regents of the University of California--

Signed and Sealed this
Twenty-ninth Day of September, 2015

Michelle K. Lee
*Director of the United States Patent and Trademark Office*